United States Patent [19]

Leclerc et al.

[11] Patent Number: 4,743,846

[45] Date of Patent: May 10, 1988

[54] RECTANGULAR SHUNT WITH MEASUREMENT COMPENSATION SYSTEM

[75] Inventors: Marc Leclerc, Boucherville; Ryszard Malewski, St-Lambert; Jean-Paul Thivierge, Longueuil, all of Canada

[73] Assignee: Hydro-Quebec, Quebec, Canada

[21] Appl. No.: 27,254

[22] Filed: Mar. 18, 1987

[51] Int. Cl.⁴ .................. H01C 7/00; G01R 19/00; G01R 1/20

[52] U.S. Cl. .................................. 324/126; 338/49

[58] Field of Search ........................... 324/126; 338/49

[56] References Cited

U.S. PATENT DOCUMENTS 846,969  3/1907  Wohl ................................. 338/49

OTHER PUBLICATIONS

Conference: IEEE 1980 Power Engg. Soc. Summer Mtg., Minneapolis, "Elimination of the Skin Effect Error in Heavy-Current Shunts", pp. 1-6.

Primary Examiner—Reinhard J. Eisenzopf
Assistant Examiner—Stephen M. Baker
Attorney, Agent, or Firm—Oblon, Fisher, Spivak, McClelland & Maier

[57] ABSTRACT

In order to reduce errors between the measured current by a rectangular shunt and the shunt output signal voltage, such errors being due primarily to skin effect and the proximity of the shunt to the current circuit to be measured, the present invention proposes a shunt having a measuring system which compensates for these error causing effects. The shunt utilizes a measurement circuit following a path which reduces the difference between the potential produced across the shunt and the form of a current which passes therethrough. The path of the measuring circuits starts from the center of the resistive material of the shunt and progresses towards the outer surface of the resistive material in accordance with a function which is non-monotonic and which can even follow a curved path. More particularly, the shunt has a rectangular geometry to permit the maximum heat dissipation which is produced by the shunt in its continuous operating mode under ambient conditions.

6 Claims, 1 Drawing Sheet

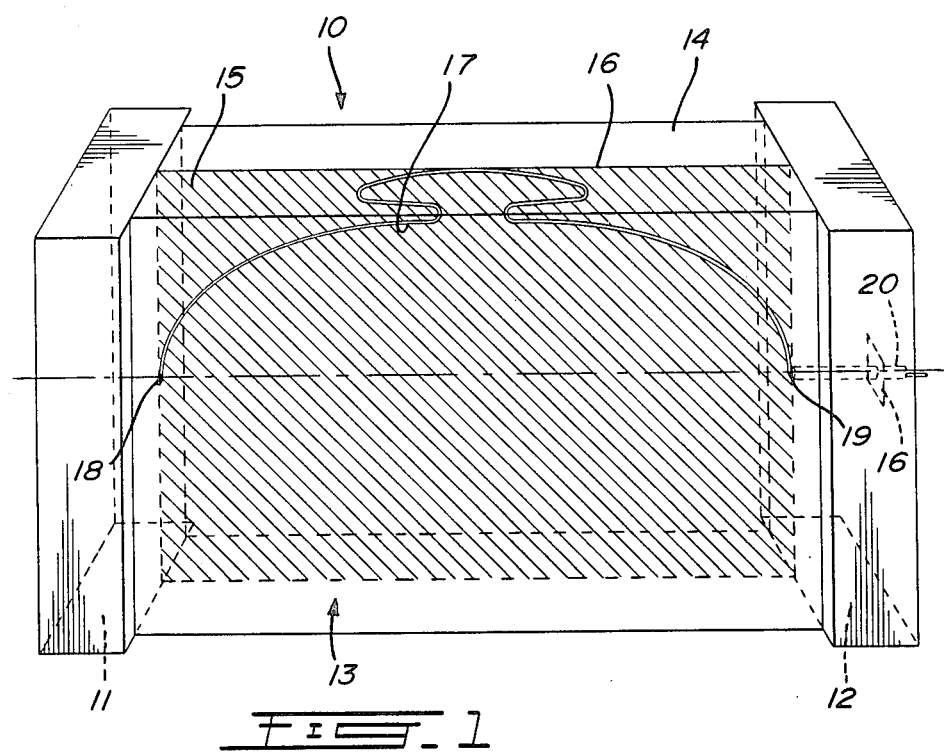

RECTANGULAR SHUNT WITH MEASUREMENT COMPENSATION SYSTEM

BACKGROUND OF INVENTION

1. Field of the Invention

The present invention relates to an improved shunt having a measuring circuit optimized to compensate for errors caused by skin effect and proximity effect of the shunt, and particularly to a rectangular shaped shunt element.

2. Description of Prior Art

A shunt functions on the principle that the passage of current therethrough produces a potential drop across the shunt and that this drop or difference in potential permits, by Ohm's law, to calculate the intensity of the current flowing therethrough. The measuring circuit to collect this potential drop measurement is constituted by a wire which is isolated within the shunt and inserted within a groove provided with the resistive material, thus constituting a monolithic shunt with a wire embedded therein.

There are two factors that can limit the utilization of a shunt:

(1) the error caused by the variation of the temperature of the resistive material; and (2) the error caused in the response of a shunt to the step current and which is caused by skin, or proximity effects.

A variation in the temperature of the resistive material of the shunt also gives rise to a variation of the nominal value of the shunt because the thermal coefficient of the resistivity is not nil. The adiabatic heating of the shunt in a short circuit mode determines the quantity of resistive material required, whilst heating of the shunt in its continuous operation determines the geometry thereof. The shunt of the present invention has a rectangular geometry which offers an efficient heat dissipation and permits the passage of a permanent high current therethrough.

The response obtained at the output of the shunt should ideally be a replica of the variable current applied at its input. The response of a standard shunt always differs from the measured current due to skin effect in the resistive material, and also due to the proximity of the shunt to the heavy current circuits.

SUMMARY OF INVENTION

In one of its broad aspects the present invention provides a shunt wherein the configuration of the measuring circuit at the interior of the resistive element is optimized such as to reduce the difference between the response of a shunt and the current applied to the shunt for a given shunt configuration and measurement wire configuration. The path of the measuring circuit within the shunt resistive element has a characteristic that is not monotonic. By not monotonic it is meant that there exists a plane having the longitudinal axis of the shunt normal thereto and which is intersected by the path of the measurement circuit more than once.

In another broad aspect the present invention provides a rectangular shunt having a measuring circuit which compensates for the skin effect and proximity effects of the shunt, and which compensation is characterized by a path of the measuring circuit which optimizes the difference in potential produced across the shunt during the passage of a strong current therethrough. This configuration commences from the center and at one end of the resistive element and progresses towards the outer surface of the resistive elements in accordance with a function which is not monotonic and which may even have a curved path. More particularly, there is proposed a shunt having a rectangular configuration to permit a maximum dissipation of heat produced by the measured currents.

BRIEF DESCRIPTION OF DRAWINGS

A preferred embodiment of the present invention will now be described with reference to FIG. 1 which is a schematic perspective view showing a rectangular shunt constructed in accordance with the present invention and having a measuring circuit which compensates for the skin effect and proximity effect of the shunt.

DESCRIPTION OF PREFERRED EMBODIMENTS

In FIG. 1, there is shown generally at 10 the shunt of the present invention which is constituted by a rectangular resistive core 13 having an input terminal 11 and an output terminal 12 for the passage of current therethrough. These terminals are connected at a respective end of the rectangular resistive core 13 which is constituted by two or more metal plates 14 and 15 secured in juxtaposition. Reference numeral 16 denotes the juxtaposed surfaces or plane between both plates, and this plane is preferably disposed on the symmetrical longitudinal axis of the shunt. At the interior of the shunt and within the juxtaposed surfaces of the plates 14 and 15, a resistive conductor is disposed within a groove or channel which has a configuration in accordance with the optimized desired profile of the measuring circuit. This measuring circuit or conductor 17 has its input end 18 located at the center of the resistive element 13 and connected to the input terminal 11. Its output end 19 is secured to a coaxial output cable 20 which extends through the output terminal 12.

The input terminal 11 and output terminal 12 may be constituted by copper or brass plates. The resistive element 13 can be constituted by a metal alloy such as constantane manganene, or nichrome.

Such a compensated rectangular shunt permits the measurement of transient currents or permanent currents in a wide frequency band width from tens of Hertz to kilo Hertz. These characteristics permit the measurement of currents, for example, in the following applications:

high power test stations or laboratories;

alternating or continuous current transmission and distribution lines; and converter stations where the current wave shape is pulsating.

We claim:

1. A measurement shunt of substantially rectangular cross-section and having a compensating circuit to reduce the skin and proximity effects of the shunt, said compensating circuit being characterized by an optimized path of a measuring circuit which reduces the difference between a measured current based on the potential produced across the shunt during the passage of a current therethrough and the current applied to the shunt, the said path extending from the center at an input end of the resistive material of the shunt and progressing towards the outer surface of the resistive material in a non-monotonic path.

2. A shunt as claimed in claim 1, wherein the configuration of the measuring circuit defines a curved path in the resistive material.

3. A shunt as claimed in claim 2, wherein said shunt is constituted by a rectangular resistive element having at one end an input terminal and at another end an output terminal for the connection and passage of a current through the shunt, said resistive element having a groove formed therein which has an optimized path and wherein a measuring conductor is located within said groove and connected at an input thereof to the input terminal and at an output thereof to a coaxial connector which extends across the output terminal.

4. A shunt as claimed in claim 3, wherein said resistive element comprises a plurality of juxtaposed metal rectangular plates.

5. A shunt as claimed in claim 4, wherein the path of the said groove is established in accordance with an optimization of the difference in potential across the shunt along the plane of the shunt which is located between two of said juxtaposed retangular resistive plates.

6. A shunt as claimed in claim 3, wherein the plane between the juxtaposed rectangular resistive plates is a symmetrical longitudinal plane.

* * * * *